United States Patent
Wei et al.

(10) Patent No.: US 8,614,123 B2
(45) Date of Patent: Dec. 24, 2013

(54) METHOD OF FORMING A SEMICONDUCTOR DEVICE BY USING SACRIFICIAL GATE ELECTRODES AND SACRIFICIAL SELF-ALIGNED CONTACT STRUCTURES

(75) Inventors: Andy Wei, Queensbury, NY (US); Peter Baars, Dresden (DE); Erik Geiss, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/305,131

(22) Filed: Nov. 28, 2011

(65) Prior Publication Data

US 2013/0137257 A1      May 30, 2013

(51) Int. Cl.
H01L 21/8238 (2006.01)
(52) U.S. Cl.
USPC ........................... 438/230; 438/229
(58) Field of Classification Search
USPC .................................. 438/229, 330
See application file for complete search history.

(56) References Cited

U.S. PATENT DOCUMENTS

| | | |
|---|---|---|
| 5,656,861 A | 8/1997 | Godinho et al. |
| 6,010,935 A | 1/2000 | Doan |
| 6,245,605 B1 | 6/2001 | Hwang et al. |
| 6,248,643 B1 | 6/2001 | Hsieh et al. |
| 6,258,714 B1 | 7/2001 | Shrivastava |
| 6,329,252 B1 | 12/2001 | Lin |
| 6,861,751 B2 | 3/2005 | Tao |
| 7,541,271 B2 | 6/2009 | Chung |
| 7,563,701 B2 | 7/2009 | Chang et al. |
| 7,605,414 B2 | 10/2009 | Chung |
| 2006/0017098 A1* | 1/2006 | Doczy et al. ............... 257/330 |
| 2009/0087974 A1* | 4/2009 | Waite et al. ............... 438/592 |
| 2011/0156107 A1* | 6/2011 | Bohr et al. ............... 257/288 |
| 2011/0248362 A1 | 10/2011 | Guo et al. |

\* cited by examiner

*Primary Examiner* — Bradley K Smith
(74) *Attorney, Agent, or Firm* — Williams, Morgan & Amerson, P.C.

(57) ABSTRACT

Disclosed herein are various methods of forming a semiconductor device using sacrificial gate electrodes and sacrificial self-aligned contacts. In one example, the method includes forming two spaced-apart sacrificial gate electrodes comprised of a first material, forming a sacrificial contact structure comprised of a second material, wherein the second material is selectively etchable with respect to said first material, and performing an etching process on the two spaced-apart sacrificial gate electrodes and the sacrificial contact structure to selectively remove the two spaced-apart sacrificial gate electrode structures selectively relative to the sacrificial contact structure.

20 Claims, 7 Drawing Sheets

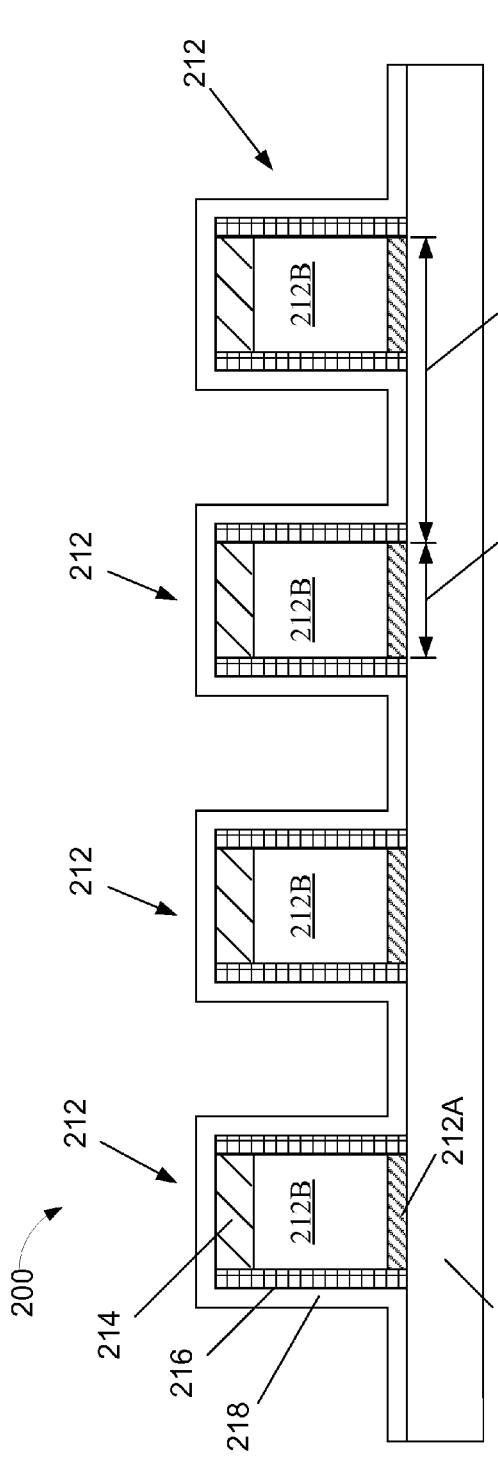
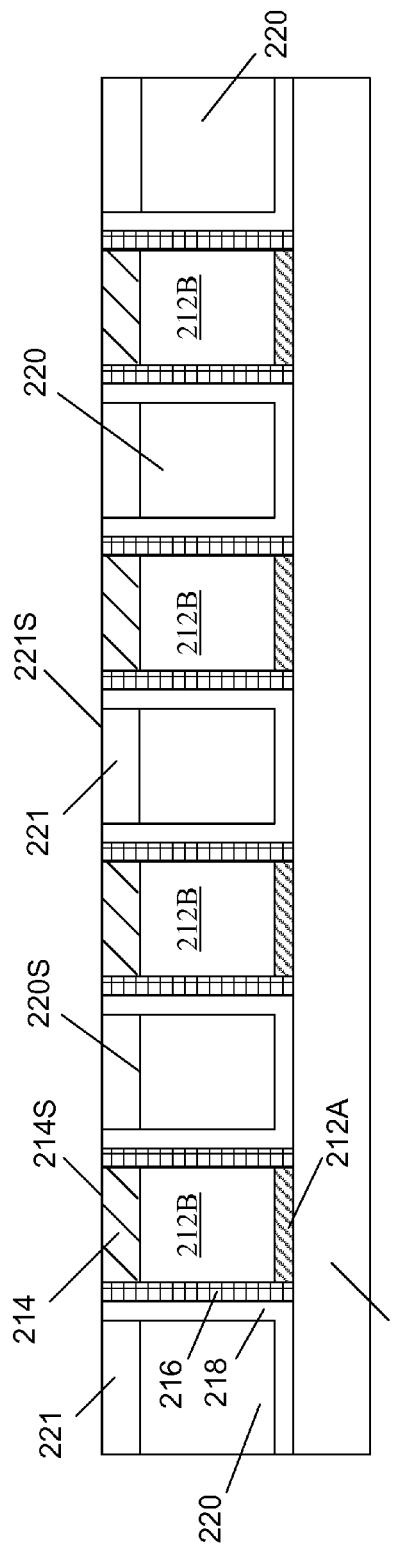

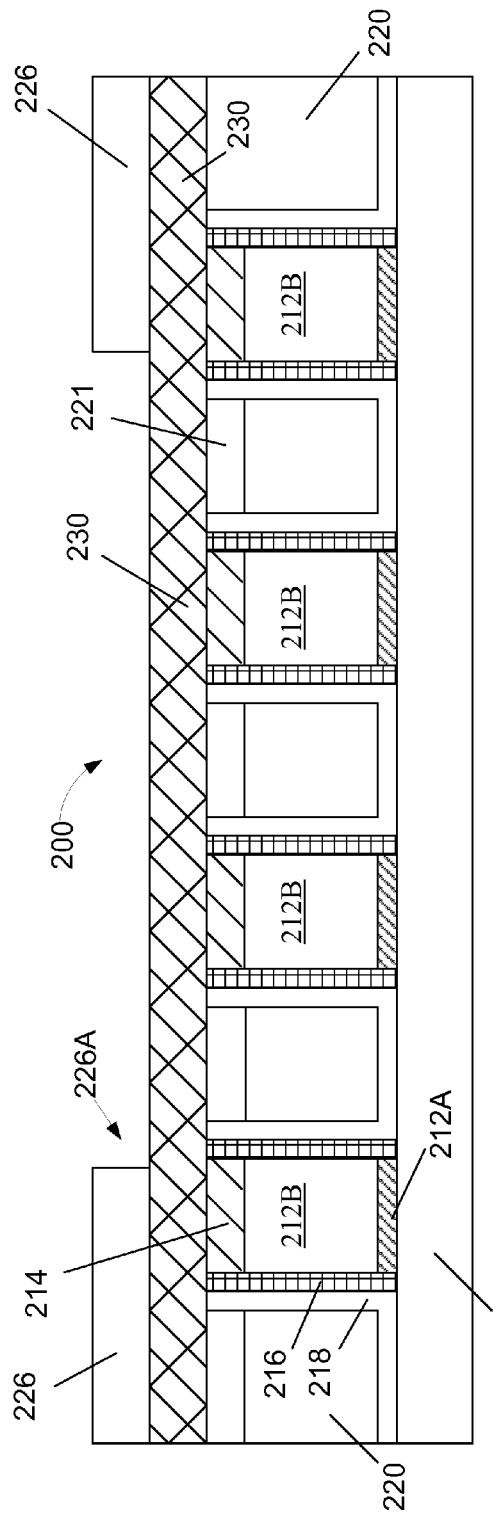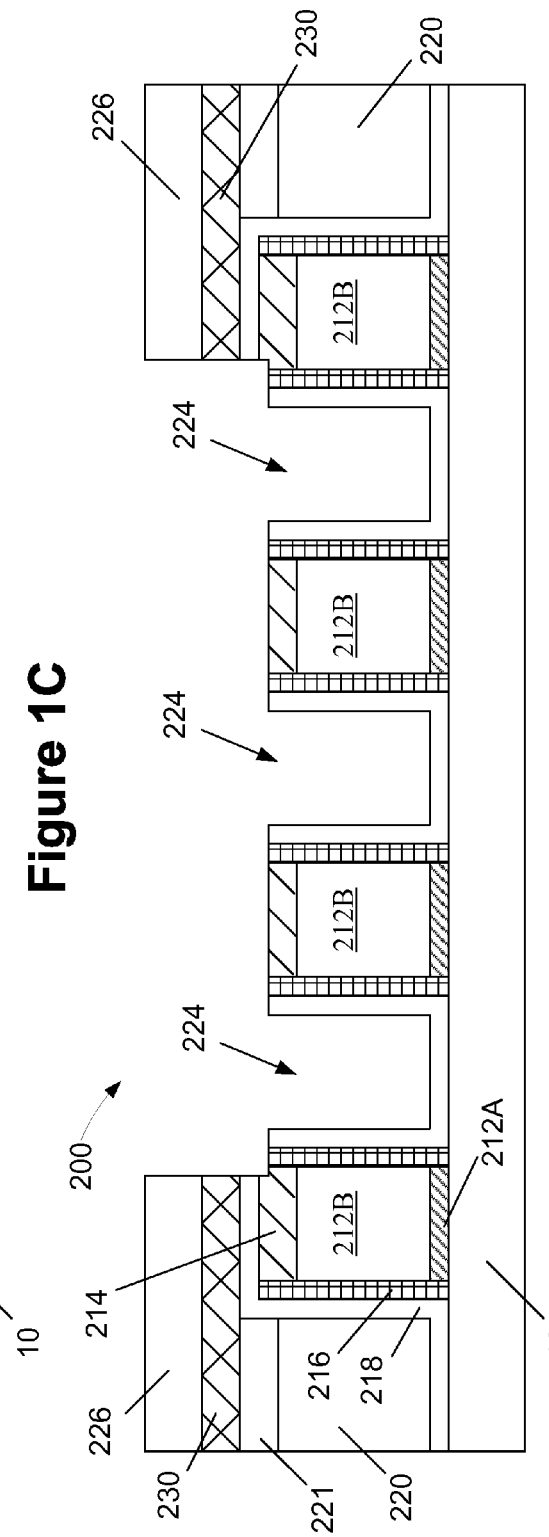
Figure 1C
Figure 1D

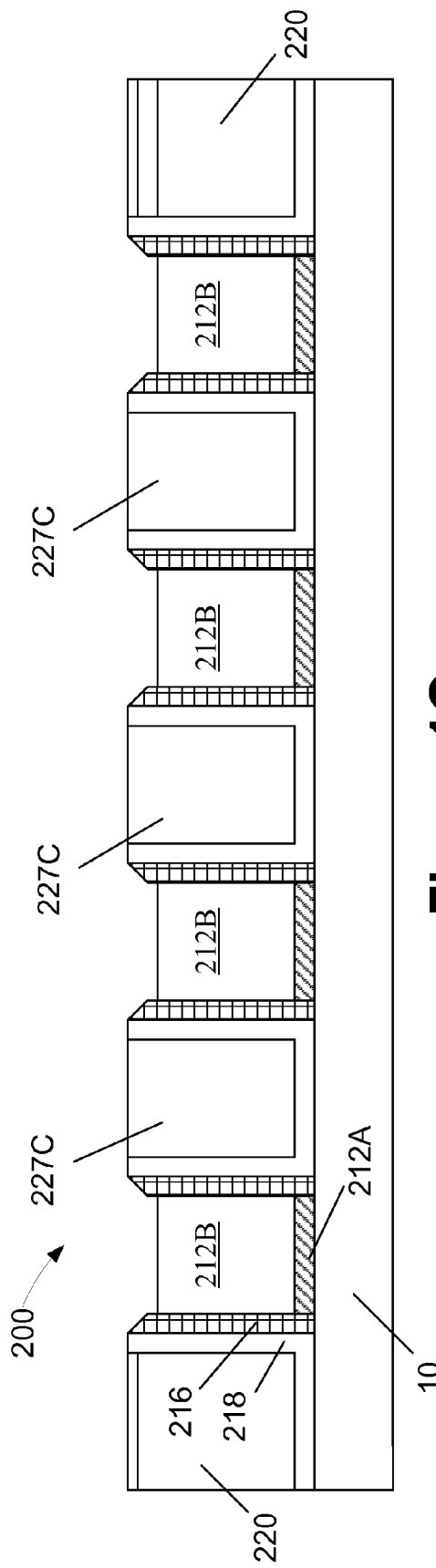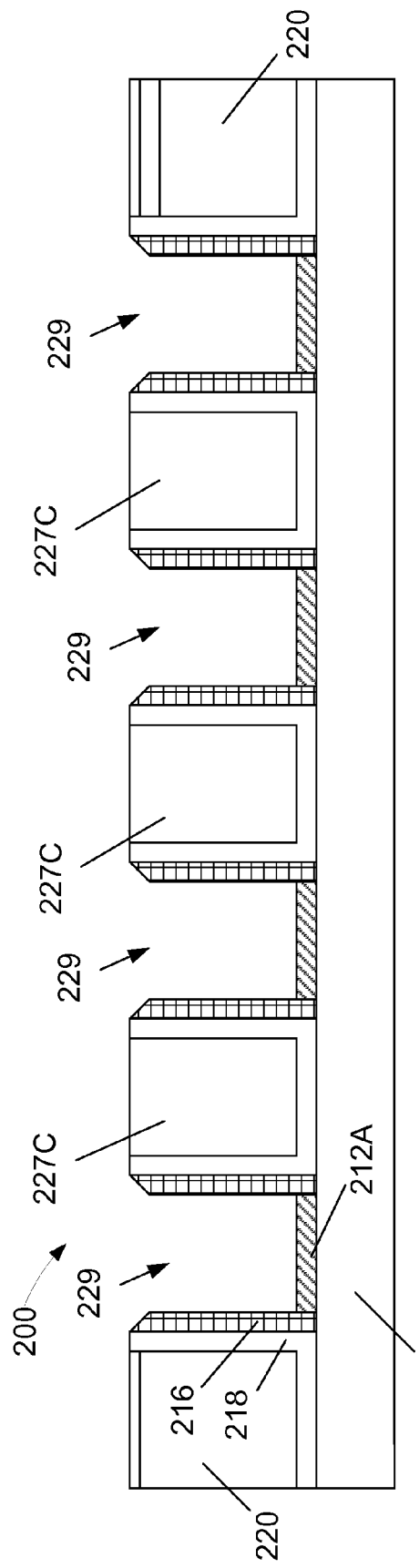

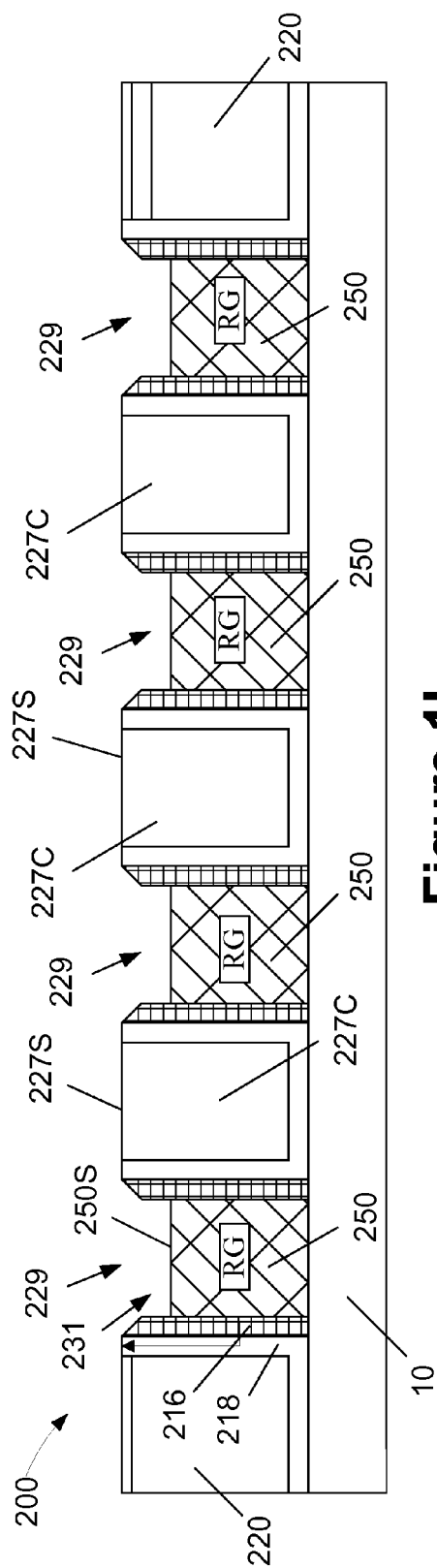
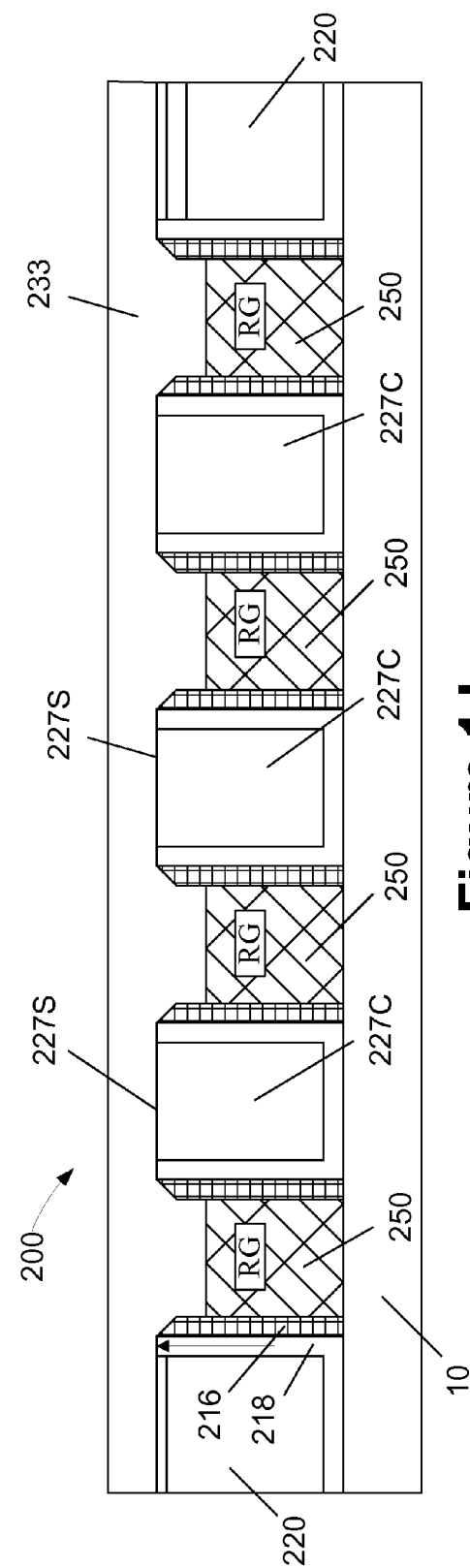

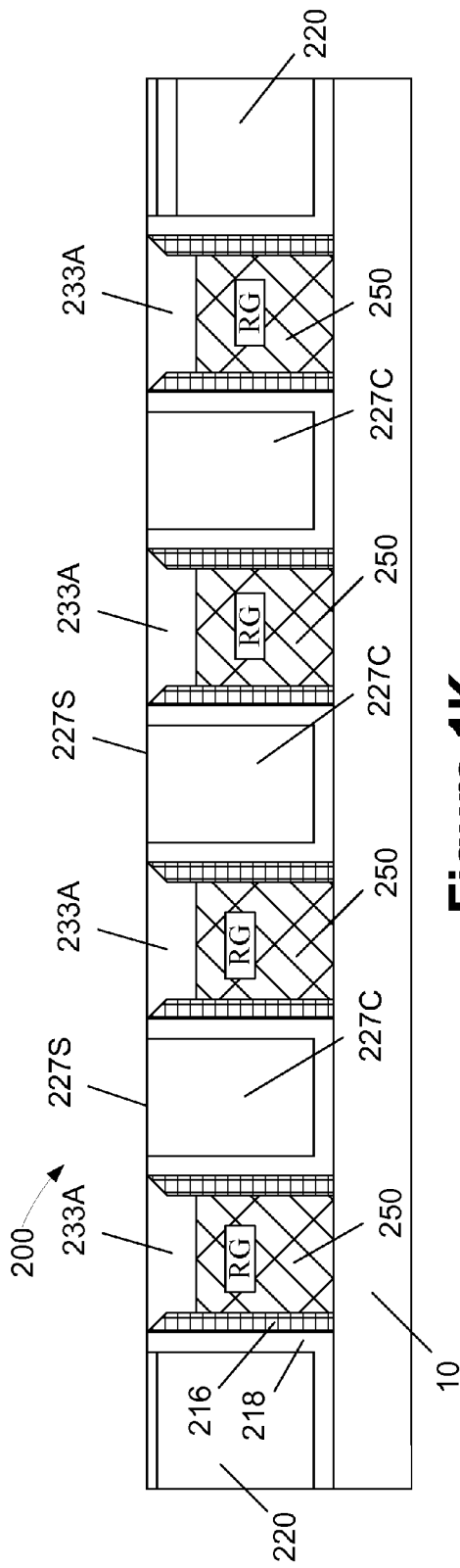
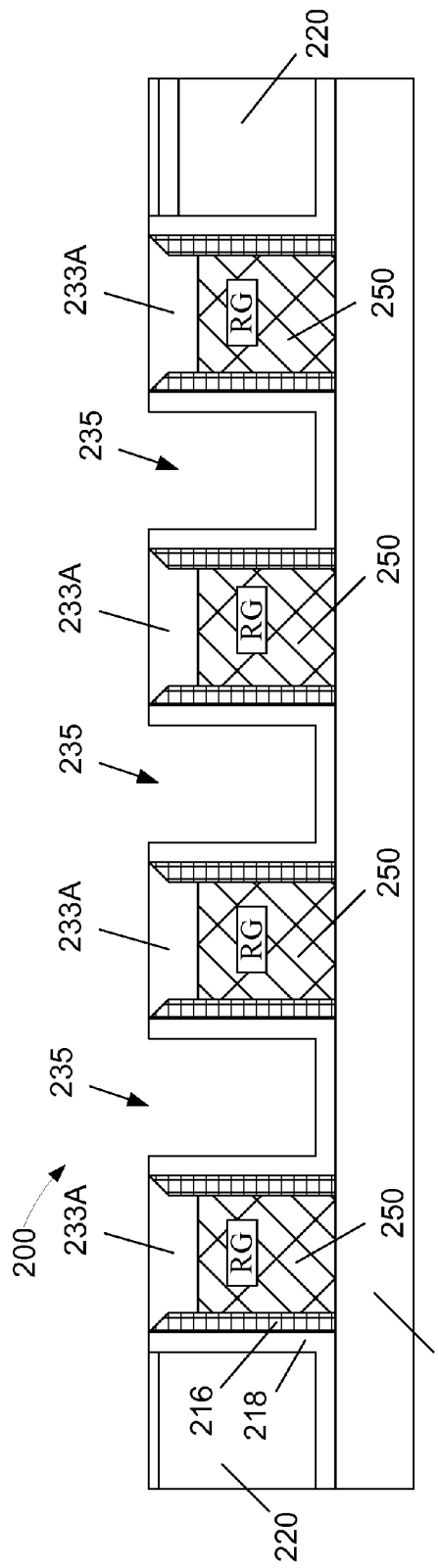

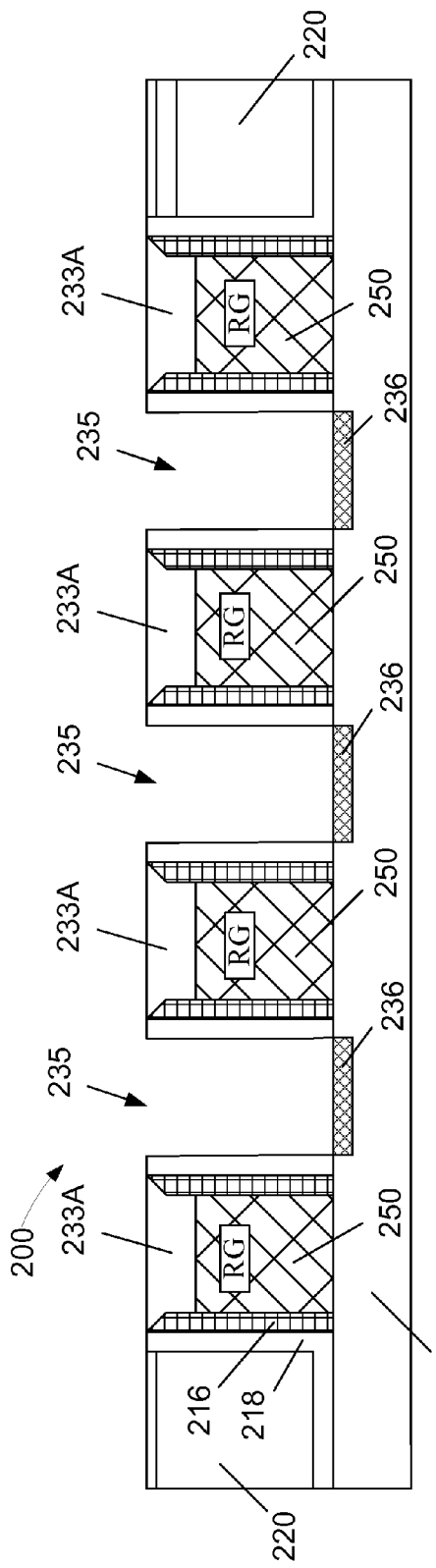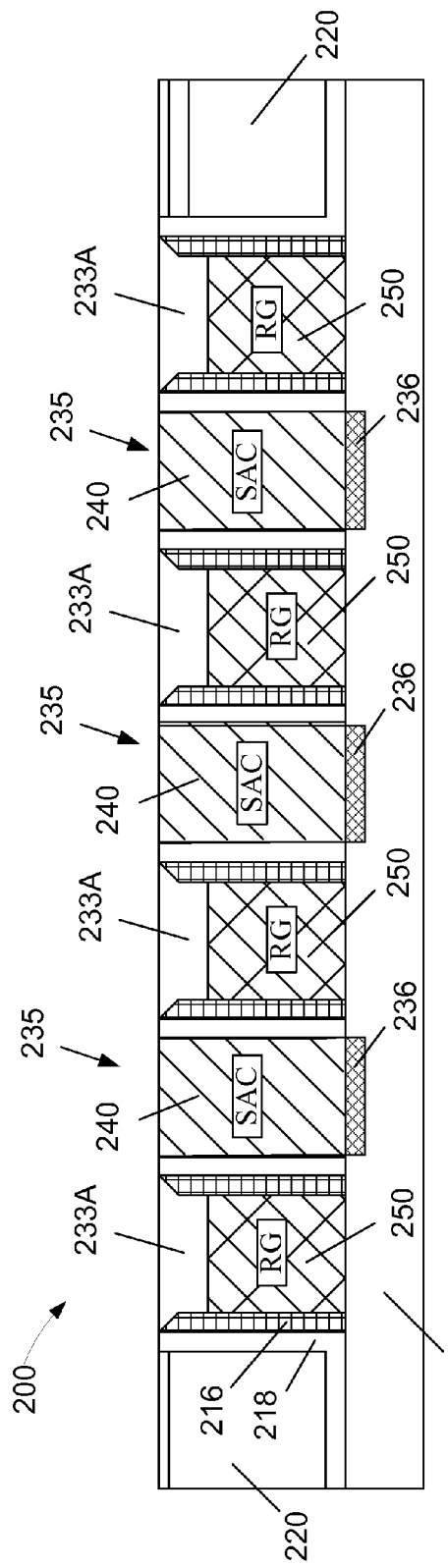

METHOD OF FORMING A
SEMICONDUCTOR DEVICE BY USING
SACRIFICIAL GATE ELECTRODES AND
SACRIFICIAL SELF-ALIGNED CONTACT
STRUCTURES

BACKGROUND OF THE INVENTION

1. Field of the Invention

Generally, the present disclosure generally relates to the manufacturing of sophisticated semiconductor devices, and, more specifically, to various methods of forming a semiconductor device using sacrificial gate electrodes and sacrificial self-aligned contacts.

2. Description of the Related Art

The fabrication of advanced integrated circuits, such as CPUs, storage devices, ASICs (application specific integrated circuits) and the like, requires a large number of circuit elements to be formed on a given chip area according to a specified circuit layout, wherein field effect transistors represent one important type of circuit element that substantially determines performance of the integrated circuits. In modern integrated circuits, such as microprocessors, storage devices and the like, a very high number of circuit elements, especially transistors, are provided and operated on a restricted chip area. Although immense progress has been made over recent decades with respect to increased performance and reduced feature sizes of the circuit elements, there is an constant demand for enhanced functionality of electronic devices which forces semiconductor manufacturers to steadily reduce the dimensions of the circuit elements and to increase the operating speed thereof.

However, with some modern devices, operating speed of complex integrated circuits is no longer limited by the switching speed of the individual transistor element, but rather by the electrical performance of the complex wiring system used in such an integrated circuit device. Such a wiring system may be formed above the device level and it may include the actual semiconductor-based circuit elements, such as transistors and the like. Typically, due to the large number of circuit elements and the required complex layout of modern integrated circuits, the electrical connections of the individual circuit elements cannot be established within the same device level, on which the circuit elements are manufactured, but require the use of one or more additional metallization layers, which generally include metal-containing lines providing the inner level electrical connection, and also include a plurality of inter-level connections or vertical connections, which are also referred to as vias. These interconnect structures can be made of a variety of different materials, e.g., copper, tungsten, etc. and they provide the electrical connection to the various stacked metallization layers and the individual circuit elements.

Typically, an appropriate vertical contact structure is provided, which connects, on one end, to a respective contact region of a circuit element, such as a gate electrode and/or the drain and source regions of transistors. The opposite end of the vertical contact is conductively coupled to a respective metal line in the metallization layer and/or to a contact region of a further semiconductor based circuit element, in which case the interconnect structure in the contact level is also referred to as local interconnect. The contact structure may comprise contact elements and/or contact plugs having a generally square or round shape that are formed in an interlayer dielectric material, which in turn encloses and passivates the circuit elements. Upon further shrinkage of the critical dimensions of the circuit elements in the device level, the dimensions of metal lines, vias and contact elements also have to be adapted to the reduced dimensions, thereby requiring sophisticated metal-containing materials and dielectric materials in order to reduce the parasitic capacitance in the metallization layers and provide sufficiently high conductivity of the individual metal lines and vias. For example, in complex metallization systems, copper in combination with low-k dielectric materials, which are to be understood as dielectric materials having a dielectric constant of approximately 3.0 or less, are typically used in order to achieve the required electrical performance and the electromigration behavior as is required in view of the desired reliability of the integrated circuits. Consequently, in lower lying metallization levels, metal lines and vias having critical dimensions of approximately 100 nm and significantly less may be provided in order to achieve the required "packing density" in accordance with density of circuit elements in the device level.

Upon further reducing the dimensions of the circuit elements, for instance using critical dimensions of 50 nm and less, the contact elements in the contact level have critical dimensions that are on that same order of magnitude. The contact elements typically represent cylindrically shaped plugs, which are formed of an appropriate metal or metal composition, such as tungsten, in combination with appropriate barrier materials. When forming tungsten-based contact elements, typically the interlayer dielectric material is formed first and is patterned to define a plurality of contact openings, which extend through the interlayer dielectric material to the corresponding contact areas of the circuit elements. In particular, in densely packed device regions, the lateral size of the drain and source areas and thus the available area for the contact regions may be 100 nm and significantly less, thereby requiring extremely complex lithography and etch techniques in order to form the contact openings with well-defined lateral dimensions and with a high degree of alignment accuracy. In some cases, despite a manufacturer's best efforts, there are errors in forming the contact openings in the proper location. When the conductive contacts are formed in these misaligned openings, the performance of the resulting device may be degraded, if not destroyed.

As noted above, continued reduction in feature sizes, causes manufacturers to redesign process techniques and to develop new process strategies and tools so as to comply with the new design rules. For example, current-day planar transistors for use in a very sophisticated integrated circuit device may have gate lengths on the order of 15-25 nm, and the gate electrode structures of such an integrated circuit device may be formed with a gate pitch on the order of approximately 80 nm. As device dimension have continued to shrink over the years, it is becoming more and more difficult to precisely form the conductive contacts and to accurately position the metal line that connects to such contacts. More specifically, with the gate pitch at approximately 80 nm, it is very difficult to accurately locate a metal line to connect to the conductive contacts without also running the risk of the of a misaligned metal line shorting-out to a nearby gate electrode. Such inaccuracies can, at best, lead to reduced device performance and, at worst, to complete device failure. The aforementioned difficulties are anticipated to be even more problematic as device dimension continue to shrink. For example, if the gate pitch of a future generation of such integrated circuit devices is reduced to approximately 56 nm, then, all other things being equal, there may not be any margin for error or "process window" for forming such conductive contacts and metal lines.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a semiconductor device using sacrificial gate electrodes and sacrificial self-aligned contact structures. In one example, the method includes forming two spaced-apart sacrificial gate electrodes comprised of a first material, forming a sacrificial contact structure comprised of a second material, wherein the second material is selectively etchable with respect to said first material, and performing a common etching process on the two spaced-apart sacrificial gate electrodes and the sacrificial contact structure to selectively remove the two spaced-apart sacrificial gate electrode structures selectively relative to the sacrificial contact structure.

In another example, the method includes forming two spaced-apart sacrificial gate electrodes made of a first material above a semiconducting substrate, forming a sacrificial contact structure made of a second material between said two spaced-apart sacrificial gate electrodes, wherein the second material is selectively etchable with respect to the first material, and performing a common etching process on the two spaced-apart sacrificial gate electrodes and the sacrificial contact structure to selectively remove the two spaced-apart sacrificial gate electrode structures selectively relative to the sacrificial contact structure, wherein the removal of the two sacrificial gate electrodes results in the formation of two gate electrode openings. The method further includes forming a replacement gate electrode structure in each of the gate openings, forming a protective cap layer above each of the replacement gate electrode structures, after forming the protective cap layer, performing another etching process on the sacrificial contact structure to remove the sacrificial contact structure and thereby define a self-aligned contact opening between the replacement gate electrode structures, and forming a final self-aligned contact structure in the self-aligned contact opening.

BRIEF DESCRIPTION OF THE DRAWINGS

The disclosure may be understood by reference to the following description taken in conjunction with the accompanying drawings, in which like reference numerals identify like elements, and in which.

Figure 1E:
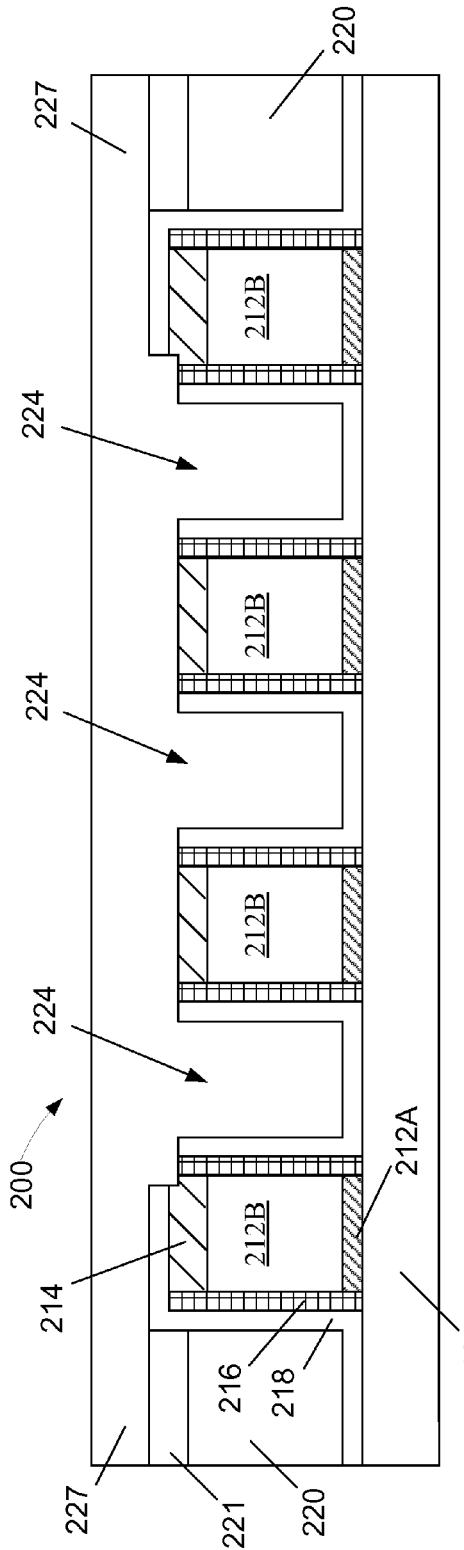
FIGS. 1A-1N depict one illustrative process flow disclosed herein for various methods of forming a semiconductor device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a semiconductor device using sacrificial gate electrodes and sacrificial self-aligned contact structures. In some cases, the devices may include a high-k dielectric material (k value greater than 10) and a metal-containing electrode material. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc. With reference to FIGS. 1A-1N, various illustrative embodiments of the methods disclosed herein will now be described in more detail.

FIG. 1A is a simplified view of an illustrative semiconductor device 200 at an early stage of manufacturing that is formed above a semiconducting substrate 10. The substrate 10 may have a variety of configurations, such as the depicted bulk silicon configuration. The substrate 10 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all forms of semiconductor structures. The substrate 10 may also be made of materials other than silicon.

The device 200 is generally comprised of a plurality of illustrative gate electrode structures 212 that are formed above the substrate 10. In one illustrative embodiment, each of the illustrative gate electrode structures 212 includes an illustrative sacrificial gate insulation layer 212A and a sacrificial gate electrode 212B. Also depicted in FIG. 1A are a gate cap layer 214 formed above the sacrificial gate electrode 212B, sidewall spacers 216 positioned proximate the sacrificial gate electrode 212B and a contact etch stop layer 218. Of course, those skilled in the art will recognize that many features of an actual semiconductor device are not depicted in the attached figures so as not to obscure the present inventions. For example, one or more isolation structures (not shown) may be formed in the substrate 10 between the gate electrode structures 212, or between groups of the gate electrode structures 212, so as to individually isolate each of the transistor devices (or groups) that will ultimately be formed on the device 200. As another example, prior to forming the sidewall spacers 216, multiple ion implant processes may be performed to form so-called halo implant regions and source/drain regions in the substrate 10, but such regions are not depicted in the drawings so as not to obscure the present inventions. As yet another example, in the case where one or more PMOS transistors are being manufactured, a plurality of recesses may be formed in the substrate 10 proximate the gate electrode structure 212 of such a PMOS transistor only, and an epitaxially grown silicon-germanium material may be formed in those recesses. The epitaxial silicon-germanium material may help to impart a desirable compressive stress in the channel region of the PMOS transistor. Such silicon-germanium materials are not depicted in the drawings for purposes of clarity. In the examples described herein, the device 200 will be depicted as having planar source/drain regions (not shown) formed in the substrate 10 between the gate electrode structures 212. However, in other cases, the device 200 may have raised source/drain regions.

The illustrative sacrificial gate insulation layer 212A may be made of, for example, silicon dioxide, and the illustrative sacrificial gate electrode 212B may be made of, for example, silicon germanium, silicon nitride, etc. or any other material that is selectively etchable to the material used to form the sacrificial self-aligned contact structures that will be describe more fully below. Moreover, in some cases, the gate insulation layer 212A may not be a sacrificial layer in that it may be the final gate insulation layer for the transistor devices. However, in the illustrative embodiment disclosed herein, and as described more fully below, when the sacrificial gate electrode 212B is ultimately removed, the sacrificial gate insulation layer 212A may also be removed and replaced with one or more additional layers of gate insulation material, which may include a high-k dielectric layer (materials having a dielectric constant greater than 10) such as hafnium oxide, zirconium oxide, etc.

The configuration and composition of the various structures and components depicted in FIG. 1A may also vary depending upon the application, and they may be manufactured using techniques well known to those skilled in the art. For example, the sacrificial gate insulation layer 212A may be a layer of silicon dioxide and/or a layer of a high-k material (k value greater than 10), and it may be formed by performing a thermal growth process or by performing a deposition process. In one illustrative embodiment, the sacrificial gate electrode 212B may be comprised of silicon germanium, silicon nitride, etc. In some cases, the gate electrode structures 212 may be relatively closely-spaced, e.g., they may have a gate pitch 211 of approximately 78-90 nm, and they may have a gate length 213 of approximately 30 nm. In another example, the gate cap layers 214, the sidewall spacers 216 and the contact etch stop layer 218 may all be made of silicon nitride, although they may also be made of different materials and they need not all be made of the same material. In one illustrative embodiment, the gate cap layers 214 may have a thickness of approximately 40 nm and the sidewall spacers 216 may have a thickness of approximately 10-15 nm. A liner (not shown) may also be provided between the spacer 216 and the sacrificial gate electrode 212B.

In a typical process flow, isolation structures (not shown) are initially formed in the substrate 10. Thereafter, the sacrificial gate insulation layer 212A is formed above the active areas of the substrate 10, e.g., a layer of silicon dioxide may be thermally grown on the substrate 10. Then, a layer of material for the sacrificial gate electrodes 212B, e.g., silicon germanium, may be blanket-deposited across the substrate 10, followed by the blanket-deposition of the material for the gate cap layers 214, such as silicon nitride, on the layer of sacrificial gate electrode material. Thereafter, a patterned masking layer (not shown), e.g., a photoresist material, is formed above the layer of material for the gate cap layers 214. Next, one or more etching processes are performed on the gate cap material layer and on the material for the sacrificial gate electrodes 212B to define the gate cap layers 214 and the sacrificial gate electrode 212B depicted in FIG. 1A. Then, the illustrative sidewall spacers 216 may be formed by blanket-depositing a layer of spacer material, e.g., silicon nitride, above the substrate 10 and performing an anisotropic etching process. The contact etch stop layer 218 may be made of silicon nitride, it may have a thickness of approximately 4 nm and it may be formed by performing any of a variety of known deposition processes, such as a plasma-enhanced atomic layer deposition process (PEALD). In some embodiments, there may be a liner layer (not shown) or other spacers (not shown) positioned between the spacer 216 and the sacrificial gate electrode 212B. Thus, the shorthand reference to the spacers 216 as the "first" spacers does not mean that such spacers were literally the first ones formed when making the device 200. Additionally, when it is stated herein or in the claims that a sidewall spacer is formed "proximate" or "adjacent" a structure or component, such as a gate electrode, such language will be understood to cover situations where such a spacer actually contacts the structure or component, as well as a situation where there are one or more intervening layers of material between the spacer and the structure or component.

Next, as shown in FIG. 1B, a layer of insulating material 220 is formed above the device 200. The layer of insulating material 220 may be made from a variety of different materials, e.g., a flowable material such as a spin-on glass, a flowable oxide, etc., and it may have a thickness of approximately 400-600 nm. In some cases, the layer of insulating material 220 may be subject to an anneal process after it is deposited on the device 200. In one example, the layer of insulating material 220 may be initially formed to a thickness that is greater than the overall height of the gate electrode structures 212. Thereafter, an etching process is performed to effectively recess the top surface 220S of the layer of insulating material 220 relative to the top surface 214S of the gate cap layers 214. Then, a second layer of insulating material 221 may be blanket-deposited across the substrate 10 and a chemical mechanical polishing (CMP) process may then be performed on the layer 221 such that the surface 221S of the remaining portions of the layer 221 is approximately even with the surface 214S of the gate cap layers 214. In one illustrative embodiment, the second layer of insulating material 221 may be a layer of HDP oxide. In the case where the first layer of insulating material 220 is, for example, a flowable oxide, the HDP oxide layer 221 acts to effectively protect the underlying flowable oxide from certain etching processes that are to be performed later.

Next, as shown in FIG. 1C, an illustrative sacrificial material layer 230 is formed above the device 200. In one illustrative embodiment, the sacrificial material layer 230 may be comprised of a siloxane-based material, one of the materials sold by Honeywell under the names DUO™ 248, DUO™ 193, and Accufill™ T-28, etc., and it may have a thickness ranging From™ approximately 50-100 nm. In general, in one embodiment, the sacrificial material layer 230 may be a material that is etchable (by RIE) like oxide, but is strippable (by a wet or a dry etch) selective to oxide. The illustrative sacrificial material layer 230 may be formed by a variety of techniques, such as by a spin-coating process. The sacrificial material layer 230 is typically not subjected to an anneal process as part of its formation process. The aforementioned DUO™ and Accufill™ materials tend to behave like a silicon dioxide with respect to reactive ion etching processes and CMP processes, but they can be wet etched selectively with respect to silicon dioxide and silicon nitride. Moreover, when the DUO™ and Accufill™ materials are oxidized to remove organic material, they can be stripped using a dilute HF acid bath (greater than 200:1 as compared to a layer of silicon dioxide made using TEOS). However, when the DUO™ and Accufill™ materials are not oxidized, they can be stripped (greater than 10,000:1 as compared to a layer of silicon dioxide made using TEOS) using a solvent-based strip such as various alcohol based materials sold by EKC, e.g., EKC270, for stripping photoresist materials. Also depicted in FIG. 1C is an illustrative patterned masking layer 226, e.g., photoresist, with a mask opening 226A, that is formed above the device 200. As can be seen in FIG. 1C, the edge of the mask layer 226 is positioned above at least a portion of an underlying gate electrode structure 212.

Next, as shown in FIG. 1D, one or more etching processes are performed to remove the exposed sacrificial material layer 230, the second layer of insulating material 221 and the first layer of insulating material 220 within the mask opening 226A. This process results in the definition of a plurality of contact openings 224 in which self-aligned contacts will subsequently be formed. The size, shape, location and configuration of the contact openings 224 and the self-aligned contacts that will eventually be formed in the contact openings 224 may vary depending upon the particular application. In the depicted example, the contact openings 224 have an illustrative rectangular configuration. However, the contact openings 224, and the resulting self-aligned contacts, may be of any desired shape or configuration.

In the case where the sacrificial material layer 230 is made of the DUO™ and Accufill™ materials, the etching of these materials tends to make the etching of the oxide based materials more selective to silicon nitride and thus helps to preserve the silicon nitride contact etch stop layer 218 at the bottom of the contact openings 224. Alternatively, the sacrificial material layer 230 may be omitted and the layers 221, 220 may be directly etched since the gate electrode structures 212 are encapsulated by silicon nitride materials. The etching process also reduces that thickness of the cap layers 214 and the height of the spacers 216 within the mask opening 226A by a relatively small amount.

Next, as shown in FIG. 1E, the remainder of the masking layer 226 and the sacrificial material layer 230 are stripped away and a layer of material 227 is blanket-deposited across the device 200. The layer 227 will be used in subsequently forming a plurality of sacrificial contact structures for the device 200. The layer 227 should be made of a material that is selectively etchable relative to the material of the sacrificial gate electrodes 212B when both of the structures are exposed to the same etching process. In one illustrative example, the layer 227 may be amorphous silicon, silicon, etc., it may have a thickness above the gate electrode structures 212 of about 60-80 nm, and it may be formed by performing a variety of know deposition processes, e.g., a chemical vapor deposition (CVD) process. In one particularly illustrative example, where the sacrificial gate electrodes 212B are made of silicon germanium, the layer 227 may be made of amorphous silicon. In general, the layer 227 should be of sufficient thickness such that it reliably fills the contact openings 224.

Figure 1F:
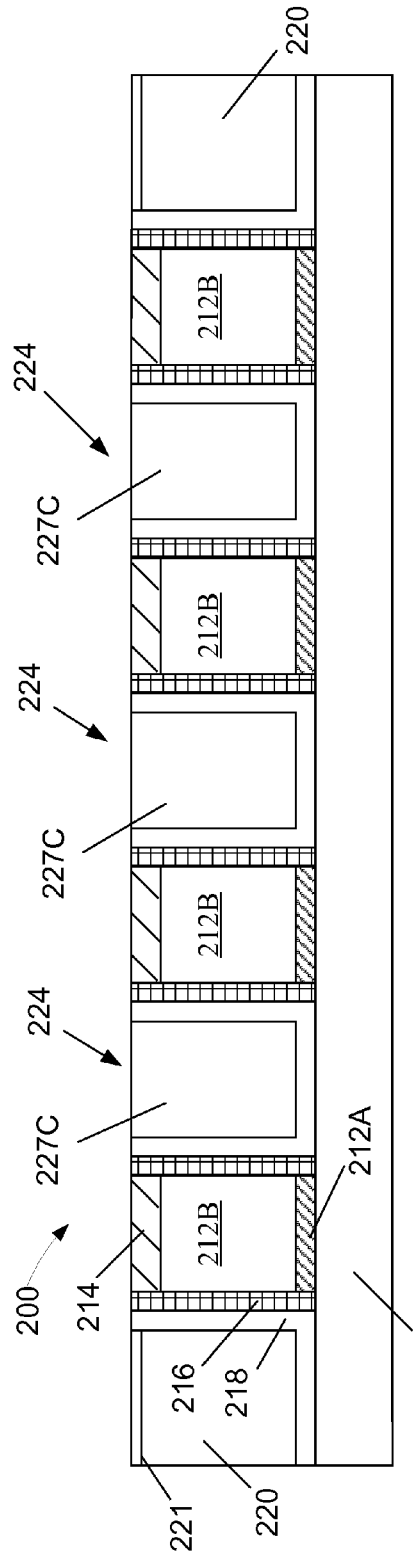

Next, as shown in FIG. 1F, a CMP process is performed to remove excess portions of the layer 227 positioned outside of the contact openings 224 and thereby form a plurality of sacrificial contact structures 227C. This CMP process stops on the gate cap layers 214.

Next, as shown in FIG. 1G, an etching process is performed to remove the gate cap layers 214 and to expose the sacrificial gate electrodes 212B to further processing. This etching process is performed with a chemistry that is selective relative to oxides and silicon, typically an etching process that involves a high oxygen flow.

Next, as shown in FIG. 1H, the sacrificial contact structures 227C and the sacrificial gate electrodes 212B are subjected to a common etching process that removes the sacrificial gate electrodes 212B selectively relative to the sacrificial contact structures 227C. This etching process results in the formation of a plurality of gate openings 229. In the illustrative example where the sacrificial gate electrodes 212B are made of silicon germanium and the sacrificial contact structures 227C are made of amorphous silicon, the etching process may be performed using SC-1. In cases where other materials are used, a different etching chemistry may be necessary to accomplished the desired selective removal of the sacrificial gate electrodes 212B relative to the sacrificial contact structures 227C. At this point in the process, the sacrificial gate insulation layer 212A remains positioned at the bottom of the gate openings 229. The next activity involves the formation of a replacement or final gate structure for the transistor devices. As part of that process, the sacrificial gate insulation layer 212A and is typically replaced by one or more additional gate insulation layers, such a high-k gate insulation layer. However, in some cases, as noted early, the sacrificial gate insulation layer 212A may remain in place and serve as one of the final gate insulation layer for the transistors. For purposes of explanation, in the following drawings, the sacrificial gate insulation layer 212A is depicted as having been removed. The removal of the sacrificial gate insulation layer 212A may be accomplished by performing one or more etching processes.

Next, as depicted in FIG. 1I, a schematically depicted replacement or final gate structure 250 ("RG") for the transistor devices is formed in the gate openings 229. As will be recognized by those skilled in the art after a complete reading of the present application, the replacement gate structure 250 may be of any desired construction and comprised of any of a variety of different materials. For example, the replacement gate structure 250 may include a high-k gate insulation layer and one or more layers of metal, such as titanium nitride, aluminum, titanium, tantalum, lanthanum, any type of work-function adjusting material, etc. Additionally, the replacement gate structures 250 for NMOS devices may have a different material combinations as compared to the replacement gate structures 250 for PMOS devices. Thus, the particular details of construction of replacement gate electrode structures 250, and the manner in which such replacement gate electrode structures 250 are formed, should not be considered a limitation of the present invention.

In the illustrative example depicted herein, the replacement gate structures 250 are formed such that the top surface 250S of the replacement gate structure 250 is recessed relative to the surrounding structures, such as the top surface 227S of the sacrificial contact structures 227C. The magnitude of this recess 231 may vary depending upon the particular application, but, in general, the recess 231 may be approximately 50-75 nm deep. Depending upon, among other things, the materials of construction of the replacement gate structure 250, the recess 231 may be formed using a variety of techniques. In one illustrative example, where the last metal used in forming the replacement gate structure 250 comprises aluminum, the recess 231 may be formed as follows. Initially, a layer of aluminum may be blanket-deposited across the device 200 and into the gate openings 229 such that the layer of aluminum overfills the remaining unfilled portions of the gate openings 229. Thereafter, a reflow process may be performed to convert the aluminum to TiAl$_3$ using known reflow techniques. Thereafter, a CMP process is performed to remove the excess aluminum positioned above and outside of the gate openings 229, i.e., the CMP process results in the layer of aluminum being approximately planar with the upper surface 227S of the sacrificial contact structures 227C. After the CMP process, an etching process is performed using, for example, ACT970 AlOx strip, to remove portions of the aluminum such that the depth of the recess 231 may be accurately controlled.

Then, as shown in FIG. 1J, a layer of protective material 233 is blanket deposited above the device 200. The layer 233 may be comprised of a variety of materials, such as silicon nitride, silicon oxynitride, etc. The layer 233 may be formed using, for example, a CVD process, and the thickness of the layer 233 should be such that it reliably overfills the recesses 231.

Next, as shown in FIG. 1K, a CMP process is performed to remove excess portions of the layer 233 and to expose the upper surfaces 227S of the sacrificial contact structures 227C to further processing. This CMP process results in the definition of protective cap layers 233A that act to protect the underlying replacement gate structures 250 from further processing. In one illustrative embodiment, the protective cap layers 233A may have a thickness of approximately 20 nm.

Next, as shown in FIG. 1L, an etching process is performed to remove the exposed sacrificial contact structures 227C, a process that results in the formation of a plurality of self-aligned contact openings 235. In the illustrative example where the sacrificial contact structures 227C are comprised of amorphous silicon, the etching process may be performed using TMAH.

Next, as shown in FIG. 1M, an etching process is performed to remove exposed portions of the contact etch stop layer 218 at the bottom of the self-aligned contact openings 235, and a plurality of metal silicide regions 236 are formed in the substrate 10 at the bottom of the self-aligned contact openings 235 to facilitate contacting source/drain regions (not shown) that have been previously formed in the substrate 10. The metal silicide regions 236 may be formed using traditional silicide formation techniques. The metal silicide regions 236 may be formed from any type of refractory metal material, such as nickel, platinum, etc., or combinations thereof. In the illustrative example where the metal silicide regions 236 are made of a nickel silicide, these regions may be formed by depositing a layer of nickel, using a CVD process, performing an initial anneal step, stripping unreacted nickel material and thereafter performing a second anneal step. The particular materials of the metal silicide regions 236, and the manner in which they are formed, should not be considered a limitation of the present invention.

Then, as shown in FIG. 1N, the next process in the formation of the device 200 involves the formation of a plurality of schematically depicted self-aligned conductive contacts 240 ("SAC") that will be electrically coupled to the metal silicide regions 236. The self-aligned conductive contacts 240 may be formed by performing known techniques and they may be comprised of a variety of different materials. For example, when the self-aligned conductive contacts 240 are comprised of tungsten, one or more barrier layers, such as titanium/titanium nitride, may be deposited above the device 200 and into the self-aligned contact openings 235. For purposes of clarity, any barrier layers associated with forming the self-aligned conductive contacts 240 are not depicted in the drawings. Thereafter, a layer of conductive material, such as tungsten, may be blanket-deposited above the device 200. Thereafter, a CMP process may be performed to remove excess amounts of the layer of conductive material, thereby resulting in the definition of self-aligned contacts 240C. In the case where the self-aligned contacts 240 are comprised of aluminum, the contacts 240 may be formed as previously describes with respect to the formation of a portion of the replacement gate structures 250, i.e., depositing a layer of aluminum, followed by performing a reflow process and then performing a CMP process to remove excess material.

From this point forward, additional processing operations may be performed on the device 200, such as the formation of additional metallization layers (not shown) above the device 200 using known techniques. The conductive structures in these additional metallization layers may also be comprised of a variety of materials, such as, for example, copper. Of course, the total number of metallization layers may vary depending on the particular device under construction.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
    forming two spaced-apart sacrificial gate electrodes comprised of a first material;
    forming a sacrificial contact structure comprised of a second material between said two spaced-apart sacrificial gate electrodes, wherein said second material is selectively etchable with respect to said first material;
    performing a common first etching process to selectively remove said two spaced-apart sacrificial gate electrode structures selectively relative to said sacrificial contact structure; and
    after selectively removing said two spaced-apart sacrificial gate electrode structures, performing a second etching process to remove an entirety of said sacrificial contact structure.

2. The method of claim 1, wherein removing said two sacrificial gate electrodes comprises forming two respective gate openings, and wherein the method further comprises forming a replacement gate electrode structure in each of said two respective gate openings.

3. The method of claim 2, further comprising forming a protective cap layer above each of said replacement gate electrode structures, wherein removing said sacrificial contact structure comprises performing said second etching process to selectively remove said sacrificial contact structure relative to said cap layers.

4. The method of claim 3, wherein removing said sacrificial contact structure comprises forming a self-aligned contact opening between said replacement gate electrode structures, the method further comprising forming a final self-aligned contact structure in said self-aligned contact opening.

5. The method of claim 1, wherein said first material is one of silicon-germanium and silicon nitride and said second material is silicon.

6. The method of claim 2, wherein said replacement gate electrode structure comprises a metal layer and a high-k dielectric material.

7. The method of claim 4, wherein said final self-aligned contact structure comprises a metal.

8. The method of claim 2, wherein said each of said sacrificial gate electrodes are formed above a sacrificial gate insulation layer and wherein the method further comprises after removing said two spaced-apart sacrificial gate electrode structures, removing said sacrificial gate insulation layers prior to forming said replacement gate electrode structures in said gate openings.

9. The method of claim 4, wherein prior to forming said final self-aligned contact structure in said self-aligned contact opening, forming a metal silicide region on a source/drain region formed in a semiconducting substrate, and wherein the method further comprises forming said final self-aligned contact so at to conductively contact said metal silicide region.

10. The method of claim 2, wherein said replacement gate electrode is comprised of TiAl3.

11. The method of claim 1, wherein said two spaced apart sacrificial gate electrodes are formed prior to the formation of said sacrificial contact structure.

12. A method, comprising:
forming two spaced-apart sacrificial gate electrodes comprised of a first material above a semiconducting substrate;
forming a sacrificial contact structure comprised of a second material between said two spaced-apart sacrificial gate electrodes, wherein said second material is selectively etchable with respect to said first material;
performing a common etching process on said two spaced-apart sacrificial gate electrodes and said sacrificial contact structure to selectively remove said two spaced-apart sacrificial gate electrode structures selectively relative to said sacrificial contact structure, wherein the removal of said two sacrificial gate electrodes results in the formation of two gate electrode openings;
forming a replacement gate electrode structure in each of said gate openings;
forming a protective cap layer above each of said replacement gate electrode structures;
after forming said protective cap layer, performing another etching process on said sacrificial contact structure to remove an entirety of said sacrificial contact structure and thereby define a self-aligned contact opening between said replacement gate electrode structures; and
forming a final self-aligned contact structure in said self-aligned contact opening.

13. The method of claim 12, wherein said first material is one of silicon-germanium and silicon nitride and said second material is silicon.

14. The method of claim 12, wherein each of said replacement gate electrode structures comprise a metal layer and a high-k dielectric material.

15. The method of claim 1, further comprising forming an etch stop layer at least between said two spaced-apart sacrificial gate electrodes, wherein forming said sacrificial contact structure comprises forming a layer comprising said second material above said etch stop layer and above said two spaced-apart sacrificial gate electrodes.

16. The method of claim 15, wherein forming said sacrificial contact structure further comprises performing a planarization process to remove said layer comprising said second material from above said two spaced-apart sacrificial gate electrodes.

17. The method of claim 3, wherein removing said sacrificial contact structure further comprises performing said second etching process to selectively remove said sacrificial contact structure relative to an etch stop layer formed at least between said replacement gate electrode structures.

18. A method, comprising:
forming two spaced-apart sacrificial gate electrodes comprised of a first material;
forming a sacrificial contact structure comprised of a second material that is selectively etchable with respect to said first material, wherein forming said sacrificial contact structure comprises:
  forming an etch stop layer at least between said two spaced-apart sacrificial gate electrodes;
  forming a layer comprising said second material above said etch stop layer and above said two spaced-apart sacrificial gate electrodes; and
  performing a planarization process to remove said layer comprising said second material from above said two spaced-apart sacrificial gate electrodes;
performing a common first etching process to selectively remove said two spaced-apart sacrificial gate electrode structures selectively relative to said sacrificial contact structure; and
after selectively removing said two spaced-apart sacrificial gate electrode structures, performing a second etching process to remove said sacrificial contact structure.

19. The method of claim 1, wherein forming said sacrificial contact structure comprises completely filling a space between said two spaced-apart sacrificial gate electrodes with an insulating material, removing an entirety of said insulating material from said space, and re-filling said space with a material layer comprising said second material.

20. The method of claim 12, wherein forming said sacrificial contact structure comprises completely filling a space between said two spaced-apart sacrificial gate electrodes with an insulating material, removing an entirety of said insulating material from said space, and re-filling said space with a material layer comprising said second material.

* * * * *